(12) United States Patent
Byagowi

(10) Patent No.: US 11,824,635 B1
(45) Date of Patent: Nov. 21, 2023

(54) HARDWARE MODULE FOR DETERMINING A CLOCK VALUE BASED ON MULTIPLE TIMING REFERENCES

(71) Applicant: Meta Platforms, Inc., Menlo Park, CA (US)

(72) Inventor: Ahmad Byagowi, Milpitas, CA (US)

(73) Assignee: Meta Platforms, Inc., Menlo Park, CA (US)

( * ) Notice: Subject to any disclaimer, the term of this patent is extended or adjusted under 35 U.S.C. 154(b) by 357 days.

(21) Appl. No.: 17/224,880

(22) Filed: Apr. 7, 2021

(51) Int. Cl.
*H04J 3/06* (2006.01)
*H03L 7/093* (2006.01)

(52) U.S. Cl.
CPC ............ *H04J 3/0667* (2013.01); *H03L 7/093* (2013.01); *H03L 2207/50* (2013.01)

(58) Field of Classification Search
CPC ..... H04J 3/0667; H03L 7/093; H03L 2207/50
See application file for complete search history.

(56) References Cited

U.S. PATENT DOCUMENTS

| | | | | |
|---|---|---|---|---|
| 5,666,330 | A * | 9/1997 | Zampetti | G04G 7/02 368/47 |
| 10,996,681 | B2 * | 5/2021 | Kwan | B60W 50/045 |
| 2021/0006344 | A1 * | 1/2021 | Chen | G01S 19/14 |
| 2022/0123850 | A1 * | 4/2022 | Adrian | H04J 3/0697 |

OTHER PUBLICATIONS

Author Unknown, "Chapter 23. Configuring PTP Using ptp4l Red Hat Enterprise Linux 6 | Red Hat Customer Portal", from <https://access.redhat.com/documentation/en-us/red_hat_enterprise_linux/6/html/deployment_guide/ch-configuring_ptp_using_ptp4l>, captured Nov. 17, 2020.
Author Unknown, "Falcon-MTS: Master Timing & Synchronization System", Oct. 31, 2019.
Author Unknown, "Integrated onsite grandmaster", retrieved from <https://www.oscilloquartz.com/en/innovation/integrated-onsite-grandmaster> on Nov. 17, 2020.
Author Unknown, "IPX-SMA Adapter cable for connecting GSM/GPRS module IPX connector to GSM antenna SMA connector", retrieved from <https://www.satel.pl/en/product/10026/IPX-SMA,Adapter-cable-for-connecting-GSM-GPRS-module-IPX-connector-to-GSM-antenna-SMA-connector> on Nov. 17, 2020.
Author Unknown, "TimeProvider 2700 | Microsemi", retrieved from <https://www.microsemi.com/product-directory/carrier-grade-ntp-ptp-grand-masters/4133-timeprovider-2700> on Nov. 17, 2020.
Sadiq Hemani, "Precision Time Protocol Grandmaster Clock: Systemization and Development of the Protocol Handler and Functional Blocks on FPGA", Jul. 2014.

* cited by examiner

*Primary Examiner* — Chandrahas B Patel
(74) *Attorney, Agent, or Firm* — Van Pelt, Yi & James LLP

(57) ABSTRACT

A hardware module includes a high stability oscillator, a satellite signal receiver, a processor, and electrical contacts. The high stability oscillator is configured to provide a first timing reference output. The satellite signal receiver is configured to receive signals transmitted by location positioning satellites and provide a second timing reference output. The processor is configured to use the first timing reference output from the high stability oscillator and the second timing reference output from the satellite signal receiver to determine an absolute physical hardware clock value and provide the absolute physical hardware clock value to a host system. The electrical contacts are configured to allow the hardware module to be electrically and physically coupled to and removable from the host system as a single physical module.

20 Claims, 6 Drawing Sheets

HARDWARE MODULE FOR DETERMINING A CLOCK VALUE BASED ON MULTIPLE TIMING REFERENCES

BACKGROUND OF THE INVENTION

Computer network time synchronization involves distributing time values to computer devices in different spatial locations. Synchronization may be required for financial transactions, telecommunications transmissions, sensor data collection, and various other applications. Various synchronization protocols can be used. For example, network time protocol (NTP) and precision time protocol (PTP) may be utilized to synchronize clocks of a computer network. Oftentimes, one or more high-precision clocks are required for synchronization of a computer network. Such clocks may be referred to as master clocks, grandmasters, time providers, or other similar terms. Master clocks are oftentimes bulky, specialized, and expensive. Thus, it would be beneficial to develop computer network clock hardware technology that is more compact, adaptable, and cost effective.

BRIEF DESCRIPTION OF THE DRAWINGS

Various embodiments of the invention are disclosed in the following detailed description and the accompanying drawings.

DETAILED DESCRIPTION

Figure 1:
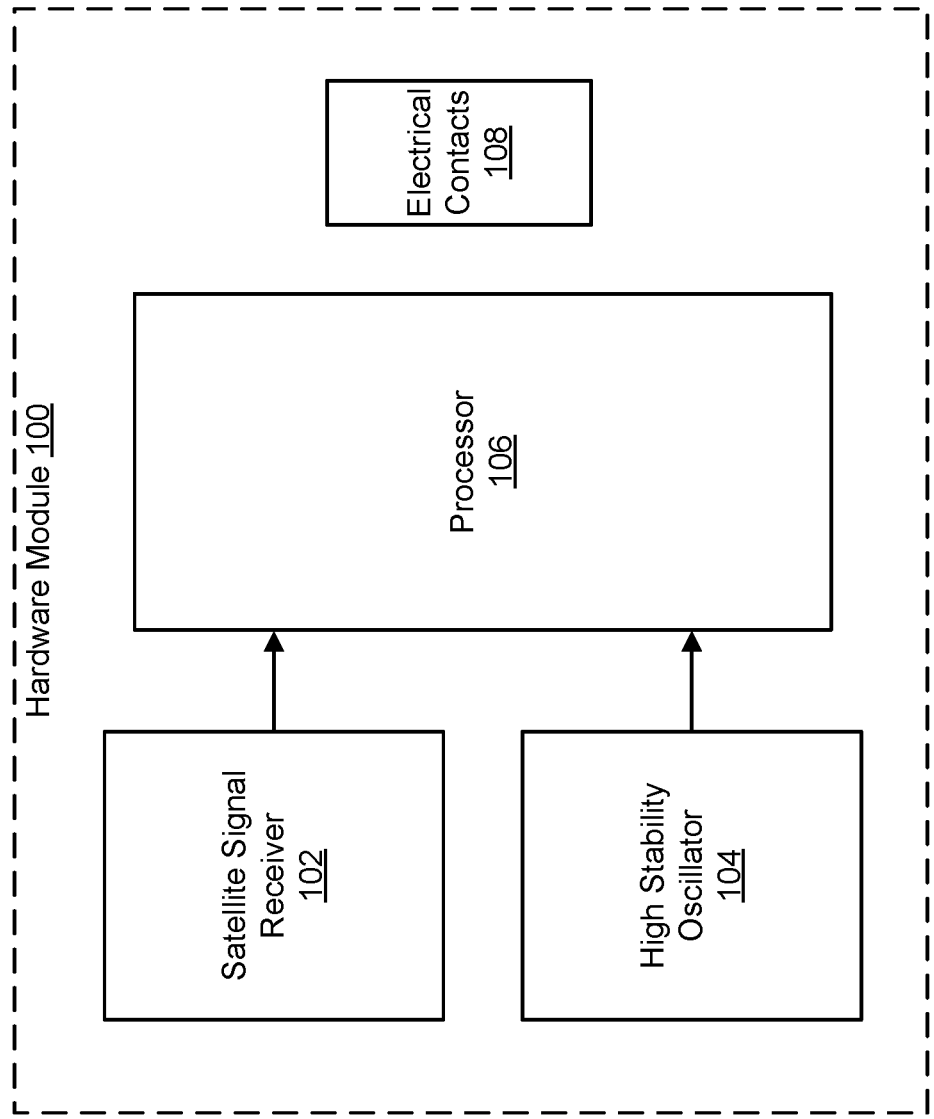
FIG. 1 is a block diagram illustrating an embodiment of a hardware module for providing physical hardware clock values.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A hardware module includes a high stability oscillator, a satellite signal receiver, a processor, and electrical contacts. The high stability oscillator is configured to provide a first timing reference output. The satellite signal receiver is configured to receive signals transmitted by location positioning satellites and provide a second timing reference output. The processor is configured to use the first timing reference output from the high stability oscillator and the second timing reference output from the satellite signal receiver to determine an absolute physical hardware clock value and provide the absolute physical hardware clock value to a host system. The electrical contacts are configured to allow the hardware module to be electrically and physically coupled to and removable from the host system as a single physical module.

A technological advantage of the hardware module disclosed herein is flexibility to include different types and different numbers of timing reference sources, such as multiple high-stability oscillators and/or Global Navigation Satellite System (GNSS) timing reference sources. In various embodiments, the hardware module is compact and does not include a network interface controller (NIC) and thus is flexible in terms of being compatible with various types of host systems. Another technological advantage is adaptability to support various network connection speeds and communications protocols. In various embodiments, there is flexibility to perform different types of clock filtering operations by utilizing a field-programmable gate array (FPGA). As described in further detail herein, the hardware module disclosed herein has an advantageous small form factor (e.g., a computer device card form) that allows it to be slotted into many types of computer host systems. Thus, high-precision timing can be provided for various host computer systems through a small timing card form factor, which is superior to approaches that involve bulky and expensive standalone time providers that cannot be incorporated into host computer systems.

The hardware module disclosed herein can be utilized as a grandmaster clock in a PTP computer network. As described in further detail herein, in various embodiments, high-precision time for accurate PTP synchronization is provided by a GNSS receiver coupled with fault tolerance holdover provided by an atomic clock. In various embodiments, the hardware module includes a high stability oscillator (e.g., an atomic clock), a GNSS receiver, an FPGA (for high stability oscillator and GNSS signal processing and general processing), and other supporting components. In various embodiments, the hardware module is configured to be able to be plugged into a host computer system, which recognizes the hardware module as a time provider device card.

FIG. 1 is a block diagram illustrating an embodiment of a hardware module for providing physical hardware clock values. In the example illustrated, hardware module 100 includes satellite signal receiver 102, high stability oscillator 104, processor 106, and electrical contacts 108.

In various embodiments, satellite signal receiver 102 is a GNSS receiver. GNSS refers to satellite-based radionavigation providing geolocation and time information to receivers (GNSS receivers) located on or near the Earth. The Global Positioning System (GPS) is a widely known example of a GNSS. Other examples include GLONASS, BeiDou, and Galileo. A GNSS includes three primary components: satellites that broadcast satellite position and time information, ground stations that monitor and manage the operational health of the satellites, and receivers (on or near the Earth) that listen for satellite broadcasted information to utilize to calculate receiver position and time. GNSS satellites carry stable atomic clocks that are synchronized with one another and with ground clocks. Each satellite transmits a radio signal including time and three-dimensional position information. A receiver that receives information from multiple satellites can utilize the information to solve equations governing receiver position and time. Typically, the receiver utilizes information from at least four satellites, corresponding to solving for four dimensions—three spatial dimensions as well as time. Solving for time (e.g., a current time common to all the GNSS satellites) for receivers in different locations results in time synchronization of the different receivers. Satellite signal receiver 102 is coupled to a physical antenna (not shown in FIG. 1) that provides signals for satellite signal receiver 102 to process. The antenna intercepts radio waves propagating through space in order to produce an electric current at its terminals. The antenna can include a low noise amplifier that increases the strength of received signals. Examples of antenna types include patch and quad helix antennas. The antenna is tuned to frequencies transmitted by satellites it is listening to.

Satellite signal receiver 102 processes signals received by an antenna. In some embodiments, satellite signal receiver 102 estimates its current position on Earth (e.g., reporting latitude, longitude, and elevation coordinates) and a time offset between an internal receiver clock and GNSS time (e.g., atomic clock time of satellites of a satellite system). In some embodiments, the time offset is utilized to synchronize satellite signal receiver 102's internal clock with the atomic clocks of a GNSS. In some embodiments, processing to estimate satellite signal receiver 102's position on Earth and the time offset is performed by electronic circuits and/or software of satellite signal receiver 102. For example, an application-specific integrated circuit (ASIC) of satellite signal receiver 102 may be configured to perform the position and time calculations. In various embodiments, satellite signal receiver 102 includes a (pulse per second) PPS generator configured to output a periodic waveform (e.g., a square wave) aligned with GNSS time. For example, the PPS generator can be configured to output a square wave at the exact start of each second of time kept by atomic clocks of a GNSS. The PPS generator can be driven by a reference oscillator of satellite signal receiver 102 (e.g., a quartz oscillator) or a reference oscillator connected to satellite signal receiver 102. A signal with a period of one second (or with another period) can be generated from the reference oscillator using electronic divider circuits. In some embodiments, time that is calculated by satellite signal receiver 102 to correspond to GNSS time is utilized to adjust the reference oscillator frequency and/or phase to cause a waveform (e.g., a square wave) associated with the reference oscillator to align with the start of each second of time kept by the GNSS. In various embodiments, satellite signal receiver 102 outputs a time of day (TOD) corresponding to GNSS time. In the example illustrated, satellite signal receiver 102 provides information (e.g., a PPS signal and TOD) to processor 106.

In the example illustrated, high stability oscillator 104 also provides information to processor 106. In various embodiments, high stability oscillator 104 is a significantly more precise clock/oscillator than what a typical computer possesses (e.g., a piezoelectric crystal oscillator). In some embodiments, high stability oscillator 104 is an atomic clock. Examples of high stability oscillator 104 include: cesium, rubidium, hydrogen maser, oven-controlled crystal oscillator (OCXO), double oven-controlled crystal oscillator (DOCXO), cesium fountain, and other clocks. GNSS signals (and thus satellite signal receiver 102) provide superior long-term stability and high stability oscillators (and thus high stability oscillator 104) provide superior short-term stability. Thus, utilizing both timing sources combines long-term stability and short-term stability to provide superior overall stability. In various embodiments, when GNSS signals become unavailable, high stability oscillator 104 provides for a holdover state. Various scenarios can require the holdover state. For example, satellite signal receiver 102 may be jammed (e.g., disrupted by deliberate use of radio transmissions to prevent listening to broadcasts from a satellite system), spoofed (e.g., fed incorrect signals intended to be mistaken for actual signals from a satellite system), or otherwise interfered with (e.g., from electronic noise emitted by other electronic devices operating legally in the same vicinity). It is also possible, though rare, for a GNSS to fail (e.g., due to a solar flare, maintenance, etc.). Stated alternatively, in some scenarios, information from satellite signal receiver 102 may be unreliable. As used herein, an outage (also referred to herein as a GNSS outage, satellite outage, satellite signal reception outage, etc.) refers to any scenario (e.g., jamming, spoofing, interference, etc.) in which satellite signal receiver 102 cannot reliably provide accurate time information. Satellite signal receiver 102 communicates to processor 106 when there is an outage event (e.g., when satellite signal receiver 102 does not receive a strong enough signal to process or receives a signal that falls outside of normal signal parameters). Processor 106 determines there is an outage event if satellite signal receiver 102 reports an outage event.

In the example illustrated, satellite signal receiver 102 and high stability oscillator 104 are communicatively connected to processor 106. Processor 106 includes logic that disciplines high stability oscillator 104. As used herein clock disciplining (or simply disciplining) refers to controlling the output of high stability oscillator 104 to agree with the signals received by satellite signal receiver 102. Hardware for clock disciplining is described in further detail herein (e.g., see FIG. 3). Processor 106 also includes logic to route and select the signals from satellite signal receiver 102 and high stability oscillator 104 to output to a host computer system. For example, in a normal operation mode, time from satellite signal receiver 102 can be outputted; whereas, during an outage associated with satellite signal receiver 102, time from high stability oscillator 104 can be outputted. In some embodiments, satellite signal receiver 102 provides PPS and TOD signals that processor 106 passes to the host computer system during normal operation. Processor 106 also handles PPS and TOD signals from high stability oscillator 104, which are sent to the host computer system during satellite signal reception outages. In various embodiments, processor 106 is programmed to detect satellite signal reception outages. In some embodiments, hardware module 100 includes multiple satellite signal receivers and/ or multiple high stability oscillators and processor 106 selects from among them (e.g., processor 106 can be programmed with a selection heuristic). Various PPS inputs/outputs and oscillator inputs/outputs can also be included on hardware module 100, which processor 106 can also handle. Stated alternatively, processor 106 processes/routes timing traffic. In some embodiments, processor 106 is an FPGA. The FPGA can be programmed with customized filtering operations. Alternative hardware implementations of processor 106 are also possible, e.g., as an ASIC or central processing unit (CPU).

Figure 6:
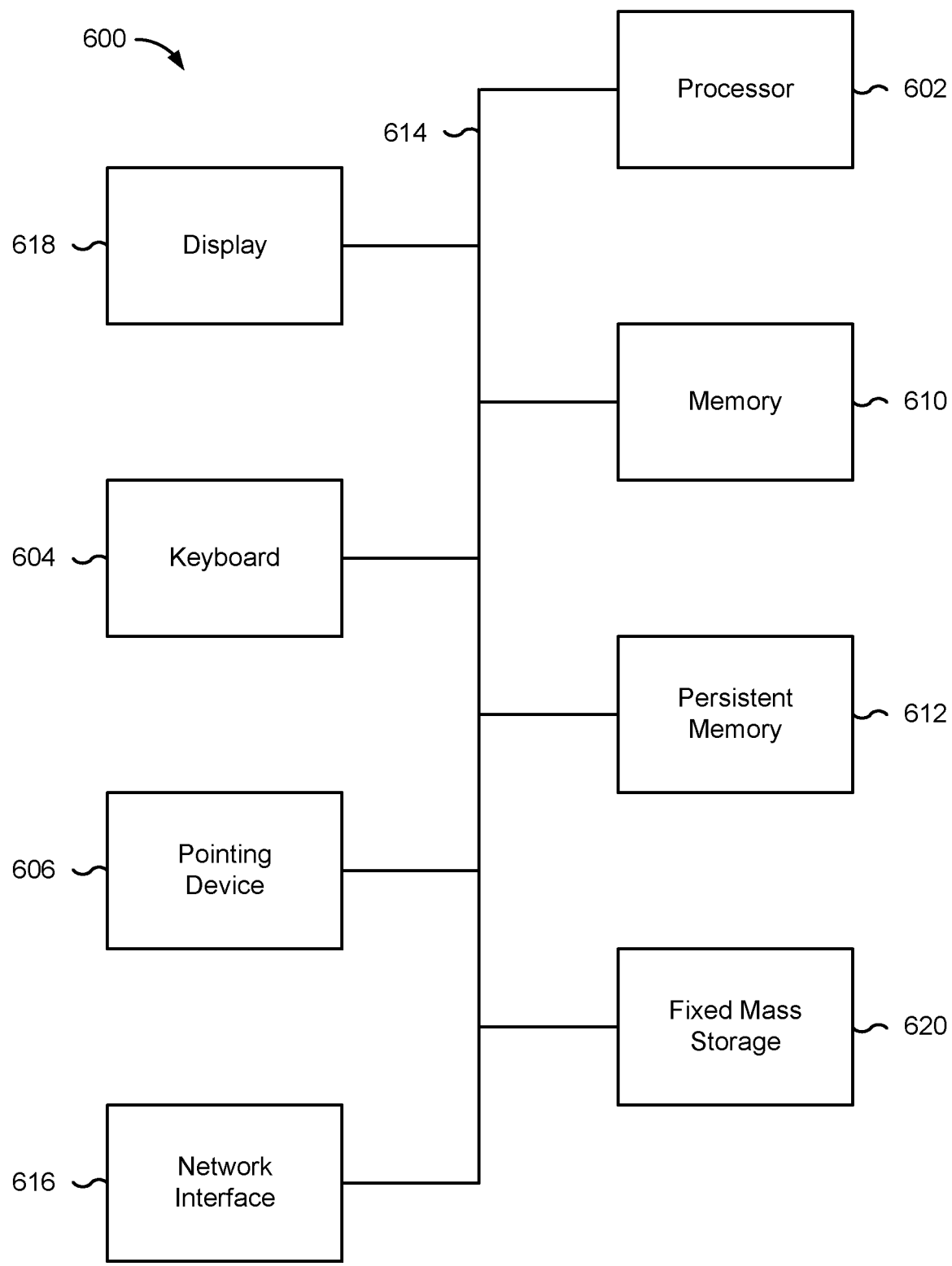
FIG. 6 is a functional diagram illustrating a programmed computer system.

In the example illustrated, electrical contacts 108 allow hardware module 100 to physically connect to a host computer system. In various embodiments, hardware module 100 slots into the host computer system and is coupled using electric contacts 108. In some embodiments, electrical contacts 108 includes one or more SMA (SubMiniature version A) connectors. Other examples of connection interfaces that can be included in electrical contacts 108 include USB, DVI, VGA, serial, serial/parallel, and various other connector types. An example of a host computer system is shown in FIG. 6. In the example illustrated, hardware module 100 does not include a network card (e.g., a NIC). In various embodiments, the network card (e.g., the NIC) is included as part of the host computer system to which hardware module 100 attaches. As used herein, NIC refers to a computer hardware component that connects a computer to a computer network. NICs may also be referred to as network interface cards, network adapters, local area network (LAN) adapters, physical network interfaces, or other similar terms. NICs implement the electronic circuitry needed to communicate among computers in a network (e.g., a LAN). Computers in a network can be synchronized by synchronizing the NICs of the computers.

Figure 5:
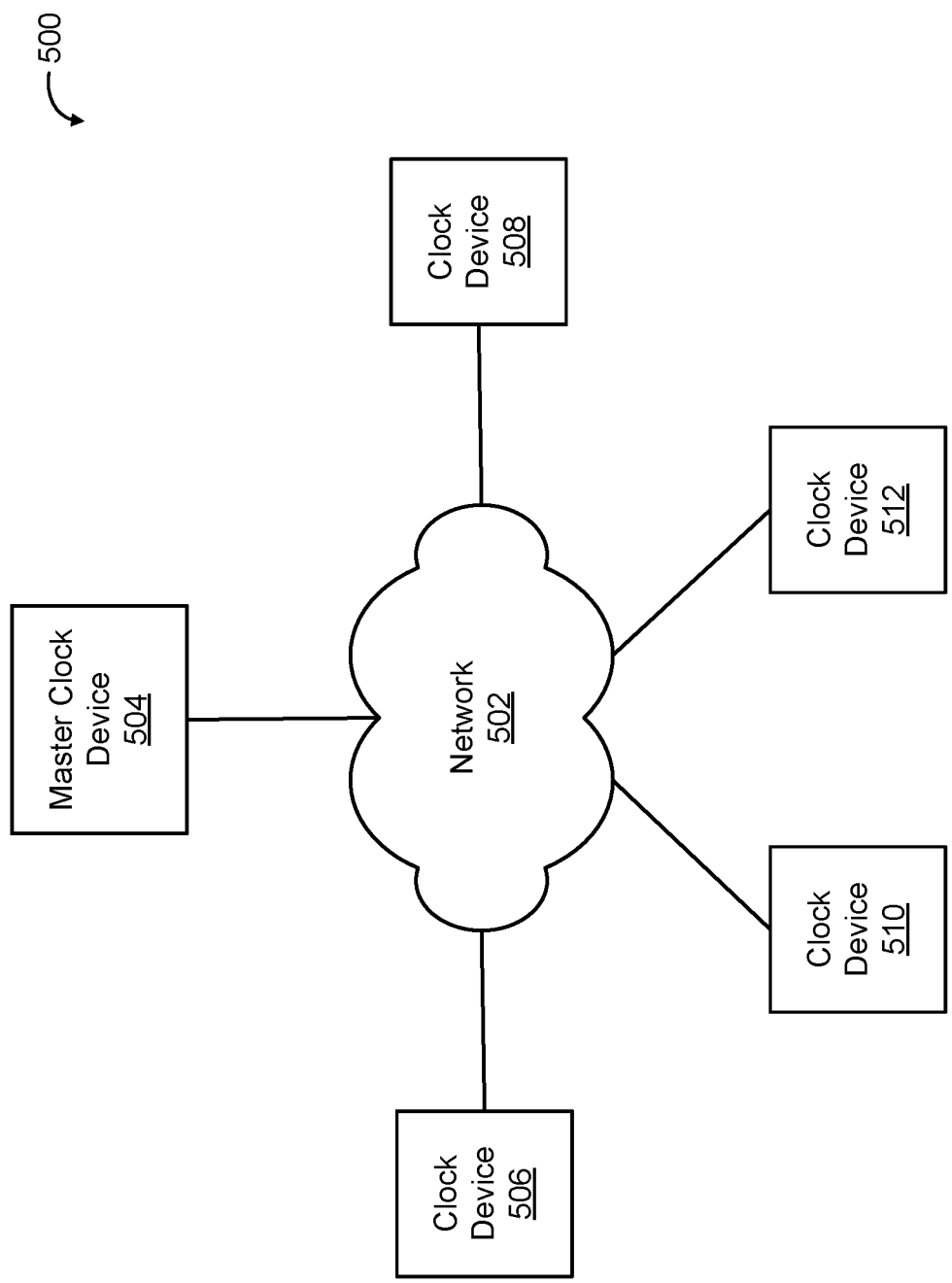
FIG. 5 is a diagram illustrating an embodiment of clock devices connected via a network.

In some embodiments, the host computer system that incorporates hardware module 100 serves as a master clock device utilized to synchronize time in a network of clock devices (e.g., see FIG. 5). NTP and PTP are commonly used protocols to synchronize clocks throughout a computer network. PTP, due to its higher accuracy, is more suitable for applications that require high precision. NTP, though, is typically easier to implement and may be more appropriate for applications that do not require the precision of PTP. PTP has been published as the IEEE-1588 standard. In various scenarios, PTP is implemented as a packet-based synchronization protocol using Ethernet connections. PTP's increased accuracy (compared to NTP) is a result of hardware time stamping and a servo mechanism to continuously reduce timing error. PTP utilizes hardware timestamping that accounts for device latency (e.g., amount of time that synchronization messages stay in a device).

In the example shown, portions of the communication path between the components are shown. Other communication paths may exist, and the example of FIG. 1 has been simplified to illustrate the example clearly. Although single instances of components have been shown to simplify the diagram, additional instances of any of the components shown in FIG. 1 may exist. For example, more satellite signal receivers and/or high stability oscillators may exist. The number of components and the connections shown in FIG. 1 are merely illustrative. Components not shown in FIG. 1 may also exist.

Figure 2:
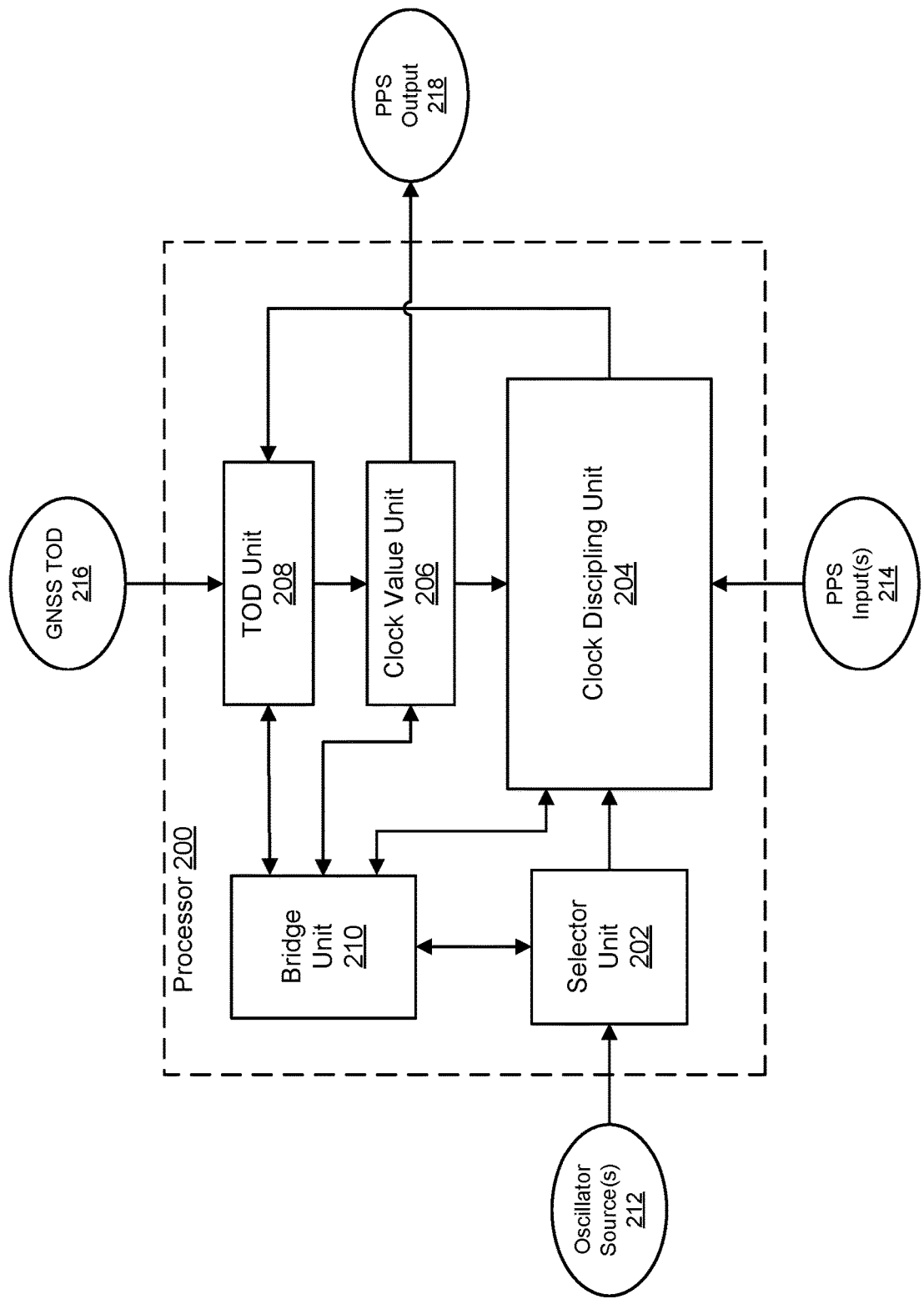
FIG. 2 is a block diagram illustrating an embodiment of a system for processing multiple timing reference outputs to determine a physical hardware clock value.

FIG. 2 is a block diagram illustrating an embodiment of a system for processing multiple timing reference outputs to determine a physical hardware clock value. In some embodiments, processor 200 is processor 106 of FIG. 1. Processor 200 may also be described as a processing unit, logic unit, etc. In the example illustrated, processor 200 includes selector unit 202, clock disciplining unit 204, clock value unit 206, TOD unit 208, and bridge unit 210. Inputs to processor 200 include oscillator source(s) 212, PPS input(s) 214, and GNSS TOD 216. In the example shown, PPS output 218 is an output of processor 200. In some embodiments, at least a portion of processor 200 is implemented as digital logic gates. For example, at least a portion of processor 200 may be implemented as digital logic gates of an FPGA. The various units of processor 200 refer to different functional units that can be implemented with different collections of digital logic. It is also possible for at least a portion of processor 200 to be implemented as an ASIC or CPU.

In the example illustrated, selector unit 202 receives oscillator source(s) 212. Selector unit 202 selects from potentially multiple oscillator sources. In various embodiments, oscillator source(s) 212 includes high stability oscillator 104 of FIG. 1. It is also possible for other oscillators to be available for selection (e.g., an oscillator external to hardware module 100 of FIG. 1 that is fed into hardware module 100 of FIG. 1, such as a large, heavy cesium clock that cannot fit on hardware module 100 of FIG. 1). In the example shown, the output of selector unit 202 (the selected oscillator signal) is received by clock disciplining unit 204. In various embodiments, clock disciplining unit 204 aligns the selected oscillator source (the output of selector unit 202) to agree with a PPS signal that is selected by clock disciplining unit 204 from among PPS input(s) 214. In some embodiments, clock discipling unit 204 includes filtering logic, control logic, and a digital phase-locked loop (DPLL). Clock disciplining hardware is described in further detail herein (e.g., see FIG. 3). In some embodiments, a PPS signal from satellite signal receiver 102 of FIG. 1 is included in PPS input(s) 214. It is also possible for other PPS signals to be available for selection by clock disciplining unit 204 (e.g., from a GNSS source external to hardware module 100 of FIG. 1). In various embodiments, during a normal operation mode, a GNSS PPS signal (e.g., from satellite signal receiver 102 of FIG. 1) is utilized as both a signal sent to a host computer system to be used for time synchronization (e.g., of other computer devices in a computer network) as well as a disciplining signal for a high stability oscillator (to align the time of the high stability oscillator with the GNSS PPS signal). By utilizing the GNSS PPS signal to discipline the high stability oscillator signal, during an outage of the GNSS PPS signal, the high stability oscillator signal will be ready to use in a holdover state because it is already aligned with the GNSS PPS signal. Thus, the high stability oscillator signal serves as a backup to ensure continuous, uninterrupted provision of precision time. Because the high stability oscillator signal typically has superior short-term stability (e.g., from a highly stable atomic clock), accurate time can be kept during GNSS outages, which are typically of a short duration relative to the stability window of the high stability oscillator.

In various embodiments, clock value unit 206 provides a current time value to clock discipling unit 204 that clock discipling unit 204 utilizes to output an updated time value. In the example shown, clock value unit 206 receives the current time value from TOD unit 208. Clock value unit 206 keeps a digital record of time. For example, clock value unit 206 can be configured to have a time resolution of 80 bits, of which 32 bits are used for sub-second time. The various bits for recording time can be stored in hardware registers that are constantly updated. In some embodiments, clock disciplining unit 204 adds or subtracts a difference value (difference in time between a GNSS PPS signal and a high stability oscillator signal) to the current time value provided by clock value unit 206 to arrive at a new output time value that is sent to TOD unit 208. The new output time value (plus a time increment corresponding to how often clock value unit 206 updates) corresponds to the current time value that is inputted to clock disciplining unit 204 (via clock value unit 206) in the next loop of disciplining. In the example shown, clock disciplining unit 204, clock value unit 206, and TOD unit 208 form a loop that acts to minimize error between a high stability oscillator and GNSS time.

In the example illustrated, TOD unit 208 receives GNSS TOD 216. Stated alternatively, TOD unit 208 receives time of day information from a GNSS source that it can pass on to a host computer system (information pathway not shown in FIG. 2) during normal operation (absence of a GNSS related outage). By receiving an output from clock disciplining unit 204, TOD unit 208 can also pass on to the host computer system (information pathway not shown in FIG. 2) time information from the high stability oscillator that aligns with the GNSS source in the event that a GNSS outage occurs. In some embodiments, PPS output 218 is the output passed to the host computer system. PPS output 218 corresponds to the current time possessed by clock value unit 206, which accurately aligns with GNSS time as long as clock disciplining is successfully performed by clock disciplining unit 204. In some embodiments, PPS output 218 is received by a NIC of the host computer system.

In the example illustrated, selector unit 202, clock disciplining unit 204, clock value unit 206, and TOD unit 208 are communicatively connected with bridge unit 210. In various embodiments, bridge unit 210 controls configuration settings associated with selector unit 202, clock disciplining unit 204, clock value unit 206, and TOD unit 208. For example, bridge unit 210 may determine which oscillator source is selected by selector unit 202 and direct clock disciplining unit 204 to perform a specific type of filtering. In some embodiments, a host computer system provides control inputs through bridge unit 210. In some embodiments, bridge unit 210 is a peripheral component interconnect (PCI) bridge, such as a PCI express (PCIe) bridge. Stated alternatively, in some embodiments, processor 200 is part of a hardware module that is a PCI (e.g., PCIe) device. For example, in some embodiments, hardware module 100 of FIG. 1 is a PCIe device, of which processor 200 is a component. Thus, in some embodiments, hardware module 100 of FIG. 1 is connected to a host computer system through the PCIe standard and/or processor 200 communicates with the host computer system through the PCIe standard.

In the example shown, portions of the communication path between the components are shown. Other communication paths may exist, and the example of FIG. 2 has been simplified to illustrate the example clearly. Although single instances of components have been shown to simplify the diagram, additional instances of any of the components shown in FIG. 2 may exist. The number of components and the connections shown in FIG. 2 are merely illustrative. Components not shown in FIG. 2 may also exist. For example, direct connections between TOD unit 208 to a host computer system may exist.

Figure 3:
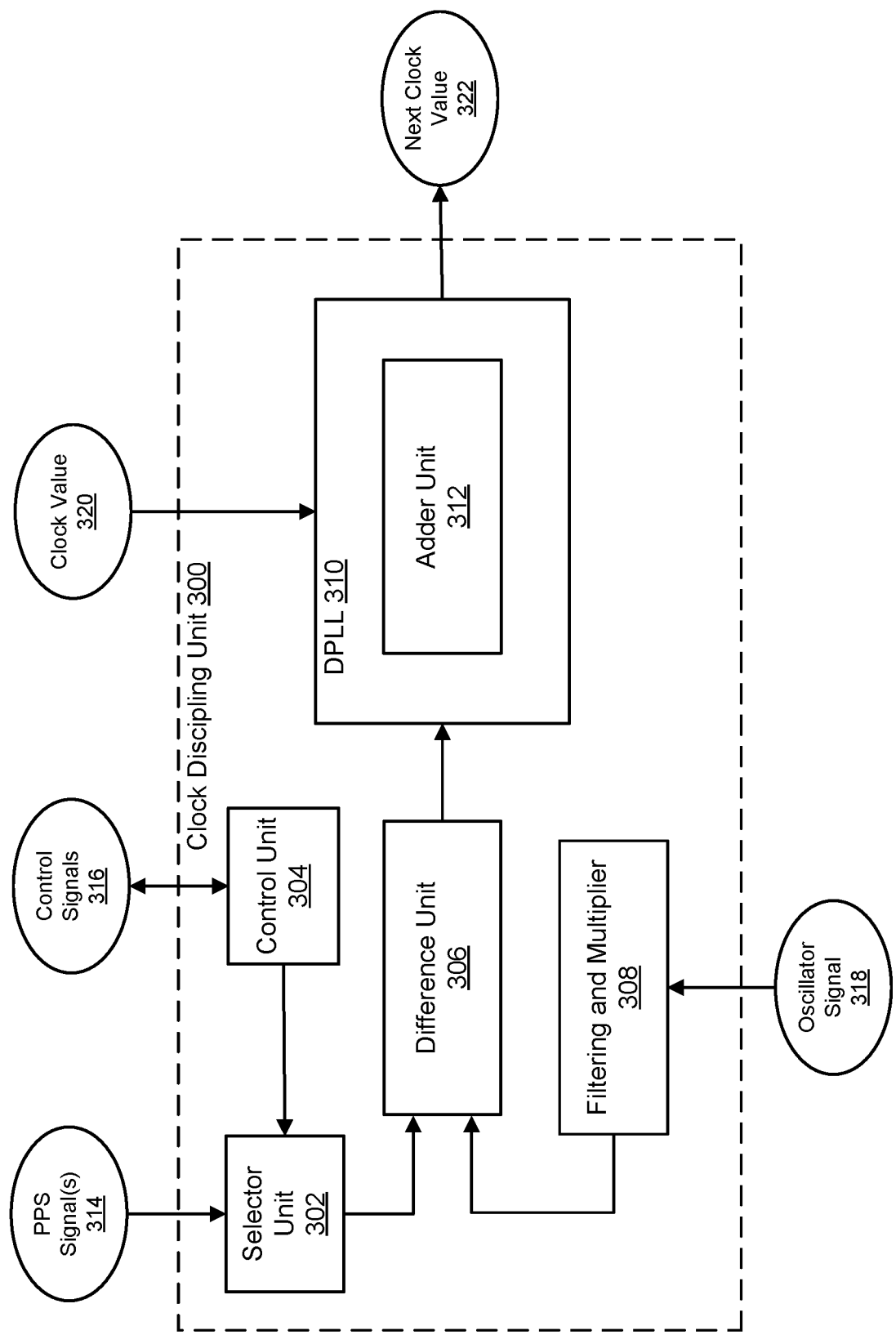
FIG. 3 is a block diagram illustrating an embodiment of a system for disciplining a clock.

FIG. 3 is a block diagram illustrating an embodiment of a system for disciplining a clock. In some embodiments, clock disciplining unit 300 is clock disciplining unit 204 of FIG. 2. In the example illustrated, clock disciplining unit 300 includes selector unit 302, control unit 304, difference unit 306, filtering and multiplier 308, and DPLL 310, which includes adder unit 312. Inputs to clock disciplining unit 300 include PPS signal(s) 314, control signals 316, oscillator signal 318, and clock value 320. In the example shown, next clock value 322 is an output of clock disciplining unit 300. In some embodiments, at least a portion of clock disciplining unit 300 is implemented as digital logic gates, e.g., as digital logic gates of an FPGA. The various units of clock disciplining unit 300 refer to different functional units that can be implemented with different collections of digital logic. It is also possible for at least a portion of clock disciplining unit 300 to be implemented as an ASIC or CPU.

In the example illustrated, selector unit 302 receives PPS signal(s) 314. Selector unit 302 selects from potentially multiple sources of PPS signal sources. In some embodiments, PPS signal(s) 314 corresponds to PPS input(s) 214 of FIG. 2. In some embodiments, control unit 304 directs selection of a PPS signal based on control signals 316. In some embodiments, control signals 316 include signals from bridge unit 210 of FIG. 2. Control signals 316 may also include information outputted by control unit 304, e.g., status information of selector unit 302 or other units to which control unit 304 can be connected, such as difference unit 306, filtering and multiplier 308, and DPLL 310 (connections not shown in FIG. 3).

Selector unit 302 routes a selected PPS signal (e.g., a GNSS signal, such as from satellite signal receiver 102 of FIG. 1) as one of the inputs to difference unit 306. The other input to difference unit 306 is a filtered and multiplied form of oscillator signal 318. In some embodiments, oscillator signal 318 is from an oscillator source selected by selector unit 202 of FIG. 2. In the example illustrated, oscillator signal 318 is received by filtering and multiplier 308. In various embodiments, filtering and multiplier 308 performs filtering of oscillator signal 318 to smooth and/or reduce noise of oscillator signal 318. Examples of filtering techniques that may be performed include direction cosine matrix (DCM), Kalman, and other filtering techniques. In various embodiments, the filtering is programmable and customizable by a user, such as when clock disciplining unit 300 is implemented on an FPGA (e.g., programming instructions from a host system can be received). In some embodiments, filtering control occurs through control signals 316 (connections not shown in FIG. 3). In various embodiments, oscillator signal 318 is multiplied by filtering and multiplier 308. For example, if oscillator signal 318 is a 10-megahertz (MHz) signal, it may be multiplied by a factor of 12.5 to create a 125 MHz signal. This multiplication results in a smaller period for the oscillator signal, which allows for finer time increments. For a 125 MHz signal, the period is 8 nanoseconds (ns).

In the example illustrated, difference unit 306 is communicatively connected to DPLL 310. In various embodiments, difference unit 306 sends a PPS difference value to DPLL 310. The PPS difference value is the difference between the selected PPS signal from selector unit 302 and the output of filtering and multiplier 308. If the output of filtering and multiplier 308 is precisely aligned with the PPS signal, the PPS difference value would be 0 ns. With the example 125 MHz signal given above, corresponding to a period of 8 ns, the maximum PPS difference value would be 8 ns. The PPS difference value is utilized by adder unit 312. Adder unit 312 combines the PPS difference value with clock value 320 to determine next clock value 322. In some embodiments, clock value 320 is a current clock value outputted by clock value unit 206 of FIG. 2. Thus, adder unit 312 corrects the current clock value with the PPS difference value. In some embodiments, next clock value 322 corresponds to the output of clock disciplining unit 204 of FIG. 2 that is sent to TOD unit 208 of FIG. 2. The next clock value depends on the period of the system clock. For the example of a 125 MHz clock, the next clock value is equal to the corrected current clock value plus the time of one period of the system clock, e.g., 8 ns.

Difference unit 306 also sends the multiplied oscillator signal (e.g., at 125 MHz) to DPLL 310 to drive oscillations of DPLL 310. In various embodiments, DPLL 310 is an all-digital phase-locked loop (ADPLL) in which a numerically-controlled oscillator (NCO) serves as a digital signal generator to create a synchronous, discrete-time, discrete-valued representation of a periodic waveform. In some embodiments, the PPS difference value is utilized by DPLL 310 to adjust its oscillation frequency. For example, for the 125 MHz (8 ns period) example, the oscillation period can be adjusted up or down (e.g., to 8.1 ns or 7.9 ns) to decrease the PPS difference value for a next iteration of determining next clock value 322. Such an adjustment can be made adaptively until the PPS difference value is zero or falls below a specified threshold. It is also possible to perform this adjustment by altering the frequency or period at filtering and multiplier 308 before or after multiplication. In some embodiments, control unit 304 provides control signals to filtering and multiplier 308 and/or DPLL 310 to configure adjustments to oscillation frequency or period (e.g., provide a heuristic or algorithm for the adjustments). In the example illustrated, adder unit 312 is included in DPLL 310. It is also possible for adder unit to be separate from but communicatively connected to DPLL 310. An advantage of a DPLL (e.g., as implemented on an FPGA) is compactness, which is advantageous for implementing a timing card in a hardware module (e.g., hardware module 100 of FIG. 1) that can be slotted into a host computer system.

In the example shown, portions of the communication path between the components are shown. Other communication paths may exist, and the example of FIG. 3 has been simplified to illustrate the example clearly. Although single instances of components have been shown to simplify the diagram, additional instances of any of the components shown in FIG. 3 may exist. The number of components and the connections shown in FIG. 3 are merely illustrative. Components not shown in FIG. 3 may also exist.

Figure 4:
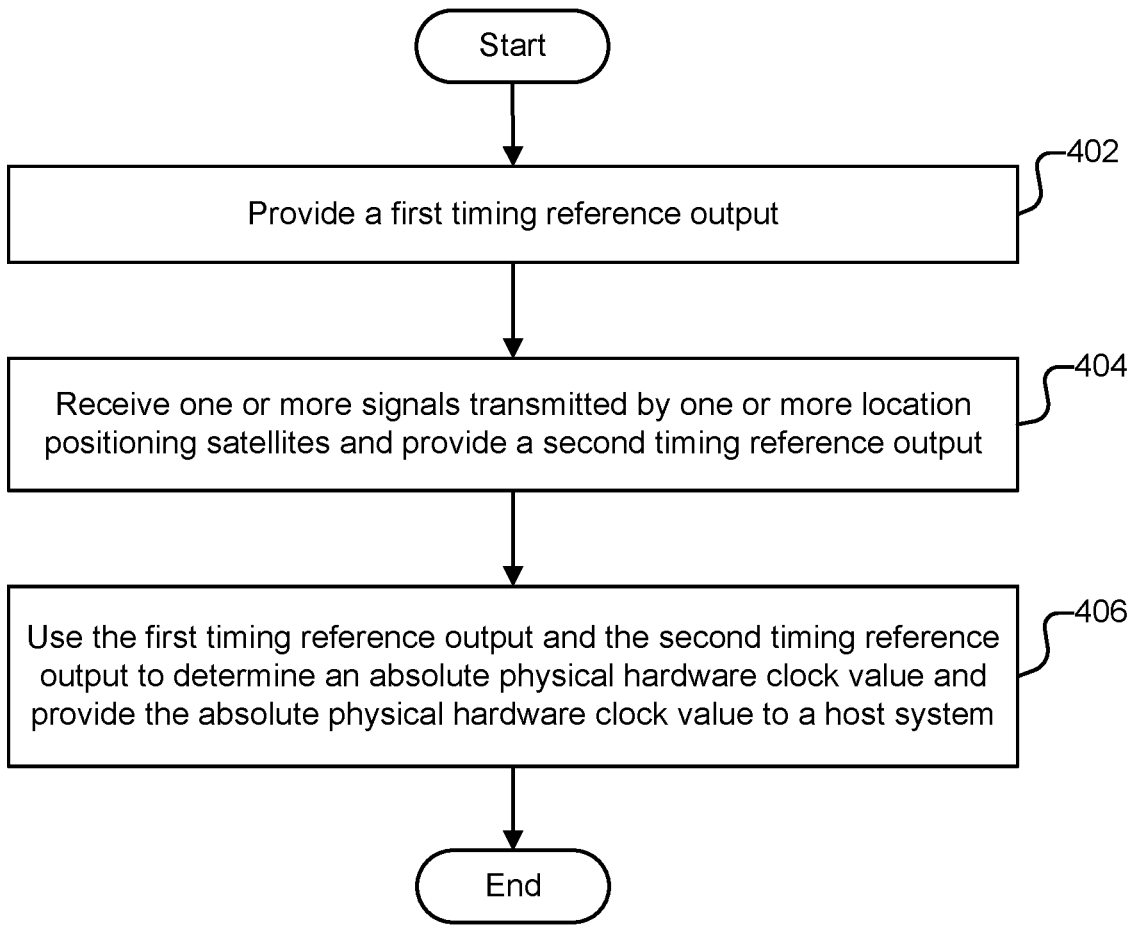
FIG. 4 is a flow chart illustrating an embodiment of a process for utilizing multiple timing reference outputs to determine a physical hardware clock value.

FIG. 4 is a flow chart illustrating an embodiment of a process for utilizing multiple timing reference outputs to determine a physical hardware clock value. In some embodiments, the process of FIG. 4 is performed by hardware module 100 of FIG. 1.

At 402, a first timing reference output is provided. In some embodiments, the first timing reference output is provided by a high stability oscillator (e.g., high stability oscillator 104 of FIG. 1). In some embodiments, the first timing reference output is a periodic signal at a specified oscillation frequency.

At 404, one or more signals transmitted by one or more location positioning satellites are received and a second timing reference output is provided. In some embodiments, the signals are received by satellite signal receiver 102 of FIG. 1. In some embodiments, satellite signal receiver 102 of FIG. 1 processes the satellite (e.g., GNSS) signals into the second timing reference output. In some embodiments, the second timing reference output includes TOD information and a PPS signal.

At 406, the first timing reference output and the second timing reference output are used to determine an absolute physical hardware clock value and the absolute physical hardware clock value is provided to a host system. The clock value is a physical hardware clock value because it is provided by a hardware source (e.g., hardware module 100 of FIG. 1). The clock value is absolute in the sense that it is a time value that is not relative to a standardized time value but rather the standardized time value itself (e.g., a GNSS time value). In various embodiments, the clock value is a GNSS time value or a time value from a high stability oscillator that has been aligned to GNSS time. Thus, the time value corresponds to a standardized time that can be considered an absolute (not relative) time value. In some embodiments, processor 106 of FIG. 1 and/or processor 200 of FIG. 2 processes the first timing reference output and the second timing reference output. In various embodiments, in scenarios in which the second timing reference output is determined to be reliable (e.g., during normal operation in the absence of a satellite related outage), the second timing reference output is transmitted to the host system (the second timing reference output oftentimes includes TOD information that can be directly transmitted to the host system) and the second timing reference output is used to discipline the first timing reference output. In some embodiments, clock disciplining unit 204 of FIG. 2 and/or clock disciplining unit 300 of FIG. 3 aligns the first timing reference output to match the second timing reference output. In various embodiments, in scenarios in which the second timing reference output is determined to be unreliable (e.g., during a satellite related outage), the first timing reference output is used (e.g., in a holdover state) to provide absolute physical hardware clock values. In some embodiments, a physical hardware clock updates itself according to oscillations of the first timing reference output. When the first timing reference output is aligned with the second timing reference output, clock values as accurate as those associated with the second timing reference output can be provided by utilizing the first timing reference output even when there is an outage associated with the second timing reference output. In some embodiments, the host system is computer system 600 of FIG. 6. In various embodiments, a processor performing 406 is part of a hardware module that includes electrical contacts (e.g., electrical contacts 108 of FIG. 1) configured to allow the hardware module to be electrically and physically coupled to and removable from the host system as a single physical module.

FIG. 5 is a diagram illustrating an embodiment of clock devices connected via a network. In system 500, master clock device 504 and clock devices 506, 508, 510, and 512 are communicatively connected to one another through network 502. The number of clock devices shown is merely illustrative. It is possible for there to be fewer or more clock devices in system 500. Examples of network 502 include one or more of the following: a direct or indirect physical communication connection, mobile communication network, Internet, intranet, Local Area Network, Wide Area Network, Storage Area Network, and any other form of connecting two or more systems, components, or storage devices together. In some embodiments, master clock device 504 is a computer system that includes hardware module 100 of FIG. 1. In some embodiments, the clock devices are computers with NICs. For example, physical hardware clocks (PHCs) located on NICs can be utilized to keep time. In various embodiments, each PHC generates internal hardware clock values corresponding to the time kept by the PHC. In various embodiments, the PHC is an integrated circuit clock, such as a silicon-based or quartz crystal-based oscillator. In some embodiments, PHCs utilize 80-bit counters (80 binary digits), of which 32 bits measure sub-second time.

In various embodiments, the clocks in system 500 exhibit timing errors that are remedied with a network synchronization protocol such as NTP, PTP, or another protocol. In the example illustrated, master clock device 504 serves as a master clock against which other clocks are synchronized. The master clock device may be referred to as a grandmaster, time provider, or another similar term. The grandmaster is oftentimes a clock that is of higher quality and is more accurate than the other clocks. Clocks other than the grandmaster can be ordinary clocks (non-grandmaster clocks with a single network connection, also referred to as slaves), boundary clocks (clocks with multiple network connections that can synchronize one network segment to another), or transparent clocks (clocks that modify messages passing through and can measure and adjust for network delays). The clock devices in system 500 may be communicatively connected in a variety of different topologies. The types of clock devices in system 500 may also vary.

FIG. 6 is a functional diagram illustrating a programmed computer system. In some embodiments, computer system 600 is a host computer system that includes hardware module 100 of FIG. 1.

In the example shown, computer system 600 includes various subsystems as described below. Computer system 600 includes at least one microprocessor subsystem (also referred to as a processor or a central processing unit (CPU)) 602. For example, processor 602 can be implemented by a single-chip processor or by multiple processors. In some embodiments, processor 602 is a general-purpose digital processor that controls the operation of computer system 600. Using instructions retrieved from memory 610, processor 602 controls the reception and manipulation of input data, and the output and display of data on output devices (e.g., display 618).

Processor 602 is coupled bi-directionally with memory 610, which can include a first primary storage, typically a random-access memory (RAM), and a second primary storage area, typically a read-only memory (ROM). As is well known in the art, primary storage can be used as a general storage area and as scratch-pad memory, and can also be used to store input data and processed data. Primary storage can also store programming instructions and data, in the form of data objects and text objects, in addition to other data and instructions for processes operating on processor 602. Also, as is well known in the art, primary storage typically includes basic operating instructions, program code, data, and objects used by the processor 602 to perform its functions (e.g., programmed instructions). For example, memory 610 can include any suitable computer-readable storage media, described below, depending on whether, for example, data access needs to be bi-directional or uni-directional. For example, processor 602 can also directly and very rapidly retrieve and store frequently needed data in a cache memory (not shown).

Persistent memory 612 (e.g., a removable mass storage device) provides additional data storage capacity for computer system 600, and is coupled either bi-directionally (read/write) or uni-directionally (read only) to processor 602. For example, persistent memory 612 can also include computer-readable media such as magnetic tape, flash memory, PC-CARDS, portable mass storage devices, holographic storage devices, and other storage devices. A fixed mass storage 620 can also, for example, provide additional data storage capacity. The most common example of fixed mass storage 620 is a hard disk drive. Persistent memory 612 and fixed mass storage 620 generally store additional programming instructions, data, and the like that typically are not in active use by the processor 602. It will be appreciated that the information retained within persistent memory 612 and fixed mass storages 620 can be incorporated, if needed, in standard fashion as part of memory 610 (e.g., RAM) as virtual memory.

In addition to providing processor 602 access to storage subsystems, bus 614 can also be used to provide access to other subsystems and devices. As shown, these can include a display monitor 618, a network interface 616, a keyboard 604, and a pointing device 606, as well as an auxiliary input/output device interface, a sound card, speakers, and other subsystems as needed. For example, pointing device 606 can be a mouse, stylus, track ball, or tablet, and is useful for interacting with a graphical user interface.

Network interface 616 allows processor 602 to be coupled to another computer, computer network, or telecommunications network using a network connection as shown. For example, through network interface 616, processor 602 can receive information (e.g., data objects or program instructions) from another network or output information to another network in the course of performing method/process steps. Information, often represented as a sequence of instructions to be executed on a processor, can be received from and outputted to another network. An interface card or similar device and appropriate software implemented by (e.g., executed/performed on) processor 602 can be used to connect computer system 600 to an external network and transfer data according to standard protocols. Processes can be executed on processor 602, or can be performed across a network such as the Internet, intranet networks, or local area networks, in conjunction with a remote processor that shares a portion of the processing. Additional mass storage devices (not shown) can also be connected to processor 602 through network interface 616. In some embodiments, network interface 616 is coupled to hardware module 100 of FIG. 1 so that timing information provided by hardware module 100 of FIG. 1 can be distributed by network interface 616 to other devices via a network. In various embodiments, hardware module 100 of FIG. 1 (not shown in FIG. 6) is a subsystem of computer system 600 that is connected to computer system 600 via bus 614.

An auxiliary I/O device interface (not shown) can be used in conjunction with computer system 600. The auxiliary I/O device interface can include general and customized interfaces that allow processor 602 to send and, more typically, receive data from other devices such as microphones, touch-sensitive displays, transducer card readers, tape readers, voice or handwriting recognizers, biometrics readers, cameras, portable mass storage devices, and other computers.

In addition, various embodiments disclosed herein further relate to computer storage products with a computer readable medium that includes program code for performing various computer-implemented operations. The computer-readable medium is any data storage device that can store data which can thereafter be read by a computer system. Examples of computer-readable media include, but are not limited to: magnetic media such as hard disks, floppy disks, and magnetic tape; optical media such as CD-ROM disks; magneto-optical media such as optical disks; and specially configured hardware devices such as application-specific integrated circuits (ASICs), programmable logic devices (PLDs), and ROM and RAM devices. Examples of program code include both machine code, as produced, for example, by a compiler, or files containing higher level code (e.g., script) that can be executed using an interpreter.

The computer system shown in FIG. 6 is but an example of a computer system suitable for use with the various embodiments disclosed herein. Other computer systems suitable for such use can include additional or fewer subsystems. In addition, bus 614 is illustrative of any interconnection scheme serving to link the subsystems. Other computer architectures having different configurations of subsystems can also be utilized. In some embodiments, bus 614 is a PCIe bus.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A hardware module, comprising:
   a high stability oscillator configured to provide a first timing reference output;
   a satellite signal receiver configured to receive signals transmitted by location positioning satellites and provide a second timing reference output;
   a processor configured to use the first timing reference output from the high stability oscillator and the second timing reference output from the satellite signal receiver to align the first timing reference output to the second timing reference output by being configured to iteratively determine a difference value associated with the first timing reference output and the second timing reference output, determine an absolute physical hardware clock value, and provide the absolute physical hardware clock value to a host system; and
   electrical contacts configured to allow the hardware module to be electrically and physically coupled to and removable from the host system as a single physical module.

2. The hardware module of claim 1, wherein the high stability oscillator includes an atomic clock.

3. The hardware module of claim 1, wherein the processor comprises a field-programmable gate array.

4. The hardware module of claim 1, wherein the host system includes a computer system that includes a network interface.

5. The hardware module of claim 1, wherein the host system includes a time provider for devices connected through a network.

6. The hardware module of claim 1, wherein the host system provides time for devices connected through a network using precision time protocol.

7. The hardware module of claim 1, wherein the processor includes a digital phase-locked loop.

8. The hardware module of claim 1, wherein the hardware module is configured to connect to the host system through a peripheral component interconnect express interface.

9. The hardware module of claim 1, wherein the second timing reference output includes a time of day.

10. The hardware module of claim 1, wherein the processor is further configured to receive programming instructions from the host system.

11. The hardware module of claim 1, wherein the processor is configured to iteratively determine the difference value including by being configured to determine an offset between a pulse per second signal associated with the second timing reference output and a periodic waveform associated with the first timing reference output.

12. The hardware module of claim 11, wherein the periodic waveform has been multiplied by the processor.

13. The hardware module of claim 11, wherein the periodic waveform has been filtered by the processor.

14. A hardware module, comprising:
   a high stability oscillator configured to provide a first timing reference output;
   a satellite signal receiver configured to receive signals transmitted by location positioning satellites and provide a second timing reference output;
   a processor configured to:
     determine whether the satellite signal receiver is experiencing an outage event;
     use the first timing reference output from the high stability oscillator and the second timing reference output from the satellite signal receiver to determine an absolute physical hardware clock value; and
     provide the absolute physical hardware clock value to a host system including by being configured to; and
   electrical contacts configured to allow the hardware module to be electrically and physically coupled to and removable from the host system.

15. The hardware module of claim 14, wherein the processor is configured to, in response to a determination that the satellite signal receiver is experiencing the outage event, determine the absolute physical hardware clock value based on the first timing reference output from the high stability oscillator.

16. The hardware module of claim 14, wherein the processor is configured to, in response to a determination that the satellite signal receiver is not experiencing the outage event, determine the absolute physical hardware clock value based on the second timing reference output from the satellite signal receiver.

17. A method, comprising:
   providing a first timing reference output via a high stability oscillator;
   receiving signals transmitted by location positioning satellites and providing a second timing reference output via a satellite signal receiver; and
   using the first timing reference output from the high stability oscillator and the second timing reference output from the satellite signal receiver to align the first timing reference output to the second timing reference output by iteratively determining a difference value associated with the first timing reference output and the second timing reference output and determine an absolute physical hardware clock value; and
   providing the absolute physical hardware clock value to a host system via a single physical module that is electrically and physically coupled to and removable from the host system through electrical contacts.

18. The method of claim 17, wherein iteratively determining the difference value includes determining an offset between a pulse per second signal associated with the second timing reference output and a periodic waveform associated with the first timing reference output.

19. The method of claim 18, further comprising filtering the periodic waveform.

20. The method of claim 18, further comprising multiplying the periodic waveform.

* * * * *